(12) United States Patent
Kang et al.

(10) Patent No.: US 9,554,466 B2
(45) Date of Patent: Jan. 24, 2017

(54) PRINTED CIRCUIT BOARD AND METHOD OF MANUFACTURING THE SAME

(71) Applicant: Samsung Electro-Mechanics Co., Ltd., Suwon-si (KR)

(72) Inventors: Myung-Sam Kang, Hwaseong-si (KR); Young-Gwan Ko, Seoul (KR); Sang-Hoon Kim, Gunpo-si (KR); Kang-Wook Bong, Sejong-si (KR); Hye-Won Jung, Goyang-si (KR); Yong-Wan Ji, Gwangju-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 14/966,518

(22) Filed: Dec. 11, 2015

(65) Prior Publication Data

US 2016/0192490 A1    Jun. 30, 2016

(30) Foreign Application Priority Data

Dec. 29, 2014    (KR) .................. 10-2014-0192477

(51) Int. Cl.
| | |
|---|---|
| *H05K 1/11* | (2006.01) |
| *H05K 3/42* | (2006.01) |
| *H05K 1/03* | (2006.01) |
| *H05K 3/00* | (2006.01) |

(52) U.S. Cl.
CPC .............. *H05K 1/115* (2013.01); *H05K 1/0326* (2013.01); *H05K 1/0346* (2013.01); *H05K 3/0023* (2013.01); *H05K 3/426* (2013.01); *H05K 3/428* (2013.01); *H05K 2201/0129* (2013.01); *H05K 2201/0154* (2013.01); *H05K 2201/09827* (2013.01); *H05K 2201/09854* (2013.01); *H05K 2203/1476* (2013.01)

(58) Field of Classification Search
CPC .... H05K 1/115; H05K 1/0326; H05K 1/0346; H05K 3/426
USPC .................... 174/258, 262; 29/853
See application file for complete search history.

(56) References Cited

U.S. PATENT DOCUMENTS 8,822,828 B2 *    9/2014    Asai ............. H05K 3/387
174/255

FOREIGN PATENT DOCUMENTS

KR    20100137811    * 12/2010

* cited by examiner

*Primary Examiner* — Timothy Thompson
*Assistant Examiner* — Charles Pizzuto
(74) *Attorney, Agent, or Firm* — NSIP Law (57) ABSTRACT

A printed circuit board and a method of manufacturing the same are provided. The printed circuit board includes an insulating layer including a first resin layer and a second resin layer, circuit layers disposed on upper and lower surfaces of the insulating layer, and a via configured to connect the circuit layer formed on the upper surface to the circuit layer formed on the lower surface, and the second resin layer extends from an upper surface of the first resin layer to a lower surface of the first resin layer by passing through the first resin layer as to contact a side surface of the via.

20 Claims, 6 Drawing Sheets

PRINTED CIRCUIT BOARD AND METHOD OF MANUFACTURING THE SAME

CROSS REFERENCE TO RELATED APPLICATION

This application claims the benefit under 35 USC 119(a) of Korean Patent Application No. 10-2014-0192477, filed on Dec. 29, 2014, in the Korean Intellectual Property Office, the entire disclosure of which is incorporated herein by reference for all purposes.

BACKGROUND

1. Field

The present disclosure relates to a printed circuit board and a method of manufacturing the same.

2. Description of Related Art

With the widespread use of electronic devices with greater capabilities and smaller sizes, demands exist to produce circuit boards for mounting components that exhibit increased circuit density and a reduced manufacturing cost.

However, there is a limitation in manufacturing fine circuits and reducing via sizes in order to form high density interlayer connections in printed circuit boards.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a printed circuit board includes an insulating layer including a first resin layer and a second resin layer, circuit layers formed on upper and lower surfaces of the insulating layer, and a via configured to connect the circuit layer formed on the upper surface to the circuit layer formed on the lower surface, and the second resin layer extends from an upper surface of the first resin layer to a lower surface of the first resin layer by passing through the first resin layer as to contact a side surface of the via.

The second resin layer may be a photosensitive resin layer.

The first resin layer may include a core board having a through hole, and the second resin layer on an upper surface of the core board may extend to the second resin layer on a lower surface of the core board via the through hole.

The via may be formed in an hourglass shape.

In another general aspect, a printed circuit board includes a core board with first circuit layers disposed on upper and lower surfaces of the core board, an insulating layer disposed on both the upper and lower surfaces of the core board and the first circuit layers, second circuit layers formed on upper and lower surfaces of the insulating layer, and a through via disposed through the core board to connect the second circuit layer of the upper surface with the second circuit layer of the lower surface, and the insulating layer penetrates through the core board to surround a side surface of the through via.

The general aspect of the printed circuit board may further include a blind via configured to connect between the first circuit layer and the second circuit layer.

The insulating layer may be a photosensitive resin layer.

The through via may have a tapered portion along a vertical direction of the printed circuit board.

In another general aspect, a printed circuit board includes a core insulating layer having a through hole, a photosensitive resin layer disposed on an upper surface and a lower surface of the core insulating layer and inside the through hole, circuit layers on an upper surface and a lower surface of the photosensitive resin layer, and a via configured to interconnect the circuit layer on the upper surface to the circuit layer on the lower surface of the photosensitive resin layer, and the via includes a through via disposed on the photosensitive resin layer inside the through hole.

The general aspect of the printed circuit board further includes an inner-circuit layer formed on each of the upper surface and the lower surface of the core insulating layer.

The through via may have a tapered portion along a vertical direction of the printed circuit board.

In another general aspect, a method of manufacturing a printed circuit board involves preparing a core board including a through hole, forming an insulating layer on both surfaces of the core board and filling the through hole, forming a via hole through the insulating layer disposed in the through hole, and forming a circuit layer including a via obtained by filling the via hole with a conductor.

The insulating layer may be a photosensitive resin layer.

The forming of the via hole may include performing a photolithography process.

The forming of the via hole may include forming a plurality of via holes at the same time using a photolithography process.

The via hole may have a smaller diameter than the through hole.

The preparing of the core board may involve forming the through hole on the core board, and forming an inner-circuit layer on both surfaces of the core board including the through hole.

The preparing of the core board may involve obtaining a board with metal layers on both surfaces of the board, eliminating metal layers from the both surfaces of the board, and forming a through hole on the board from which the metal layers are eliminated.

The forming of the circuit layer may involve forming a seed layer inside the via hole and on the insulating layer, forming a metal plating layer patterned on the seed layer, and eliminating a part of the seed layer from an area of the insulating layer where the metal plating layer is not formed to form a circuit layer.

The forming of the seed layer may be performed using sputtering or immersion plating.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

The terms used hereinafter are defined by considering their functions in the present disclosure and can be changed according to the intention, convention, etc. of the user or operator.

In descriptions of components of the disclosure, the same reference numerals are used to designate the same or similar components, regardless of the figure number. Throughout the description of the present disclosure, when describing a certain technology is determined to evade the point of the present disclosure, the pertinent detailed description will be omitted. It will be understood that, although the terms "first," "second," etc. may be used herein to describe various elements, these elements should not be limited by these terms. These terms are only used to distinguish one element from another. Additionally, components of the drawings are not necessarily drawn according to their scales. For example, sizes of some components of the drawings may be exaggerated, omitted or schematically illustrated for the convenience of understanding of the present disclosure.

Hereinafter, configurations and effects of the present disclosure will be described in detail with reference to the accompanying drawings.

Printed Circuit Board

Figure 1:
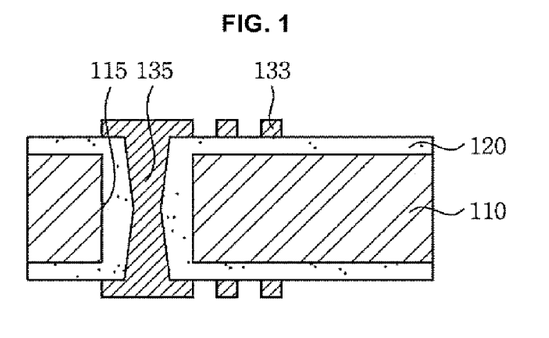
FIG. 1 is a sectional view illustrating an example of a printed circuit board according to the present disclosure.

FIG. 1 illustrates a sectional view of an example of a printed circuit board according to the present disclosure.

Referring to FIG. 1, a printed circuit board includes a core board 110 including a through hole 115, an insulating layer 120 formed on the upper surface and the lower surface of the core board 110 as well as inside the through hole 115, circuit layers 133 formed on the insulating layer 120 on the upper surface and the lower surface of the core board 110, and a via 135 configured to interconnect the circuit layer 133 on the upper surface of the core board 110 with the circuit layer 133 on the lower surface of the core board 110.

The core board 110 may be formed of any resin that is usually used as a core insulating layer material in the field of printed circuit boards. An example of the resin may include a thermosetting resin such as an epoxy resin, a thermoplastic resin such as polyimide, a photosensitive resin, or a resin thereof further including a reinforcing agent such as a glass fiber or an inorganic filler but it is not limited thereto.

The insulating layer 120 may be a photosensitive resin layer.

In this example, the insulating layer 120 is formed by extending from the upper surface of the first resin layer to the lower surface of the first resin layer through the first resin layer that contacts the side surface of the via.

The via 135 is formed through the insulating layer 120 that fills the through hole 115 to interconnect the circuit layer 133 on the upper surface of the core board 110 with the circuit layer 133 on the lower surface of the core board 110.

The via 135 may be formed in a cylindrical shape having substantially the same diameter throughout the core board 110, in a tapered shape having a decreasing diameter toward one direction, or in an hourglass shape having a tapered part of a vertically symmetrical structure. FIG. 1 illustrates an example of a via 135 that is formed in an hourglass shape.

The term of "a tapered part of a vertically symmetrical structure" used herein does not refer to a mathematically strictly vertical symmetry, but an inclined shape of which a diameter becomes gradually wider from the center point toward the upper surface and the lower surface.

The circuit layer 133 and the circuit layer including the via 135 may be formed of any conductive material which is used for circuits in the field of printed circuit boards. For example, the circuit layer may be formed of Cu but it may not be limited thereto.

The circuit layer may be composed of a seed layer and electro plating layer.

The seed layer may be composed of an immersion plating layer or a sputter deposition layer.

Figure 2:
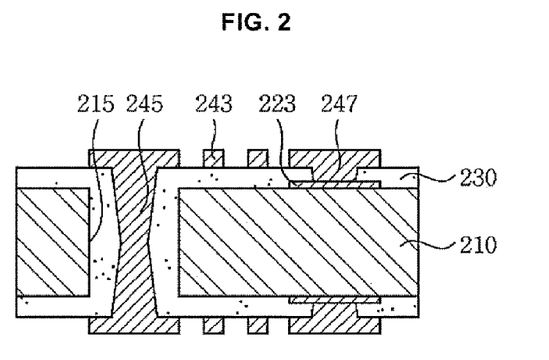
FIG. 2 is a sectional view illustrating an example of a printed circuit board according to the present disclosure.

FIG. 2 illustrates a sectional view of an example of a printed circuit board according to the present disclosure.

Referring to FIG. 2, a printed circuit board includes a core board 210 including a first circuit layer 223 in both surfaces, an insulating layer 230 formed on the both surfaces of the core board 210 including the first circuit layer, a second circuit layer 243 formed on the both surfaces of the insulating layer 230, and a through via 245 formed to connect the second circuit layers 243 of the both surfaces passing through the core board.

The core board 210 may be formed of any resin which is usually used as a core insulating layer material in the field of printed circuit boards. An example of the resin may include a thermosetting resin such as an epoxy resin, a thermoplastic resin such as polyimide, a photosensitive resin, or a resin thereof further including a reinforcing agent such as a glass fiber or an inorganic filler but it is not limited thereto.

The insulating layer 230 may be a photosensitive resin layer.

The insulating layer 230 may be formed to surround the side surface of the through via 245 passing through the core board 210.

The through via 245 may connect the second circuit layers 243 on the both surfaces.

The through via 245 may be formed in a cylindrical shape having substantially the same diameter, in a tapered shape having a decreasing diameter toward one direction, or in an hourglass shape having a tapered part of a vertically symmetrical structure.

The first circuit layer 223 and the second circuit layer 243 may be connected using a blind via 247.

The first circuit layer 223, the second circuit layer 243 and the circuit layer including the vias 245, 247 may be formed of any conductive material which is used for circuits in the field of printed circuit boards. For example, the circuit layer may be formed of Cu but it may not be limited thereto.

The circuit layer may be composed of a seed layer and electro plating layer.

The seed layer may be composed of an immersion plating layer or a sputter deposition layer.

Method of Manufacturing a Printed Circuit Board

Figure 3:
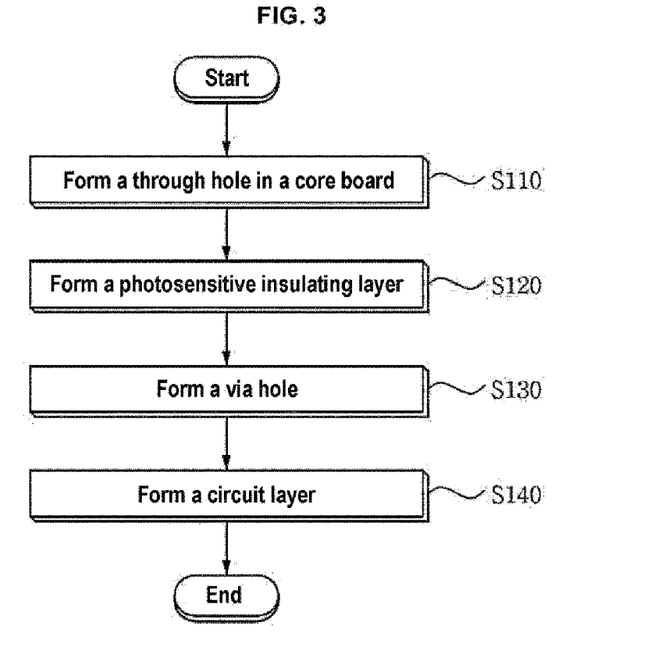
FIG. 3 is a flowchart illustrating an example of a method of manufacturing a printed circuit board according to an embodiment of the present disclosure.

FIG. 3 is a flowchart illustrating a method of manufacturing a printed circuit board according to an embodiment of the present disclosure. FIG. 4 to FIG. 7 are sectional views illustrating a method of manufacturing a printed circuit board according to an embodiment of the present disclosure.

Referring to FIG. 3, a method may include forming a through hole in a core board in S110, forming a photosensitive resin layer in S120, forming a via hole in S130, and forming a circuit layer including a via in S140.

Each step will be explained with reference to sectional views illustrated in FIG. 4 to FIG. 7.

Figure 4:
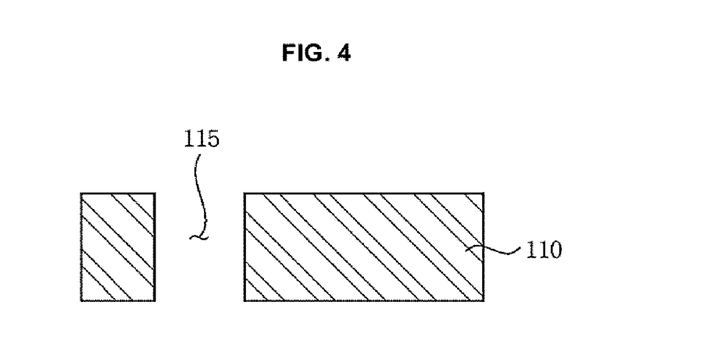
FIGS. 4 to 7 are sectional views illustrating an example of a method of manufacturing a printed circuit board according to the present disclosure.

Referring to FIG. 4, a core board 110 including a through hole 115 may be prepared.

The core board 110 may be formed of any resin which is usually used as a core insulating layer material in the field of printed circuit boards. An example of the resin may include a thermosetting resin such as an epoxy resin, a thermoplastic resin such as polyimide, a photosensitive resin, or a resin thereof further including a reinforcing agent such as a glass fiber or an inorganic filler but it is not limited thereto.

The core board 110 may be prepared by eliminating metal layers from a metal laminate including the metal layers formed on both surfaces.

The through hole 115 may be formed, for example, using a CNC drill.

The through hole 115 may be designed to have a greater diameter than a via hole to be formed later.

Figure 5:
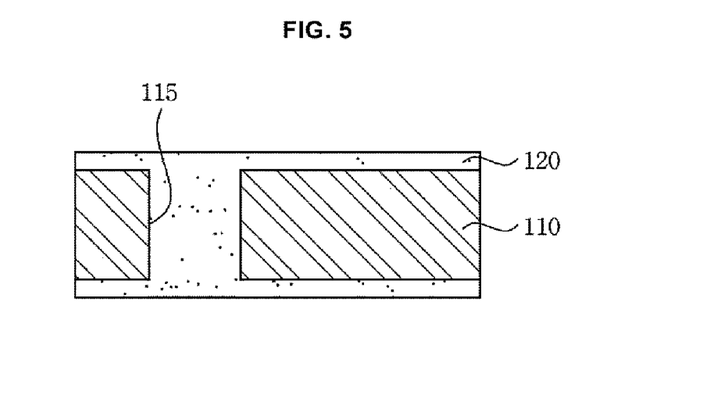

Referring to FIG. 5, an insulating layer 120 may be compressed on the both surfaces of the core board 110 to fill the through hole 115.

The insulating layer 120 may be a photosensitive resin layer.

Figure 6:
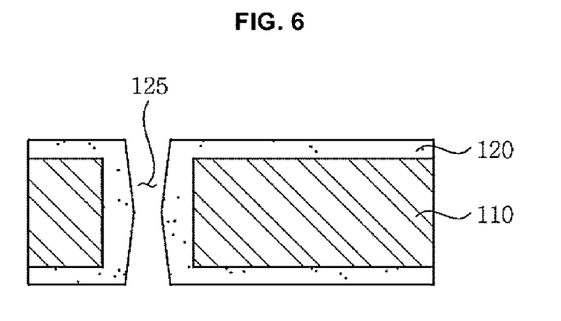

Referring to FIG. 6, a via hole 125 may be formed by processing the insulating layer 120 filled in the through hole 115.

The via hole 125 may be formed to have a smaller diameter than the through hole 115.

The via hole 125 may be formed by the photolithography process including an exposing process and a developing process.

The via hole 125 may be formed by processing in one surface or by processing both the upper surface and the lower surface of the insulating layer 120 at the same time or in order.

The via hole 125 may be formed in a cylindrical shape, in a tapered shape having a decreasing diameter toward one direction, or in an hourglass shape having a tapered part of a vertically symmetrical structure.

The present disclosure only illustrates an example of a via hole 125 in an hourglass shape that is formed by processing the upper surface and the lower surface of the insulating layer 120; however, the shape of the via hole 125 is not limited thereto.

According to an embodiment of the present disclosure, when the via hole is formed, the photolithography process may be used, instead of a conventional laser process, to reduce a via size and provide fine circuits and fine pitches. In addition, when the photolithography process is used, it may further reduce manufacturing cost since a plurality of via holes are formed at the same time.

Figure 7:
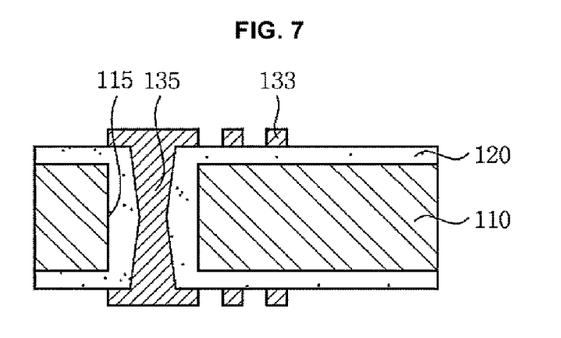

A circuit layer 133 includes a via 135 formed by filling the via hole 125 in the insulating layer 120 with a conductor.

The circuit layer 133 includes a plurality of circuit patterns.

The circuit layer 133 including the via 135 may be formed through a general circuit forming process such as a semi additive process (SAP). For example, when the circuit layer is formed by the SAP, the step of forming the circuit layer 133 including the via 135 may include forming a seed layer inside the via hole 125 and on the insulating layer 120, forming a metal plating layer including patterns on the seed layer using electro plating, and eliminating the part of the seed layer from surface area of the insulating layer 120 where the metal plating layer is not formed and thus the insulating layer 120 is exposed, using a general flash etching process.

The seed layer may be formed by sputtering or immersion plating.

According to one example of the present disclosure, a copper clad of a general copper clad laminate is not used as a seed layer but a metal layer formed by sputtering or immersion plating is used as a seed layer for electro plating, such that it may be able to provide high-density circuits.

Figure 8:
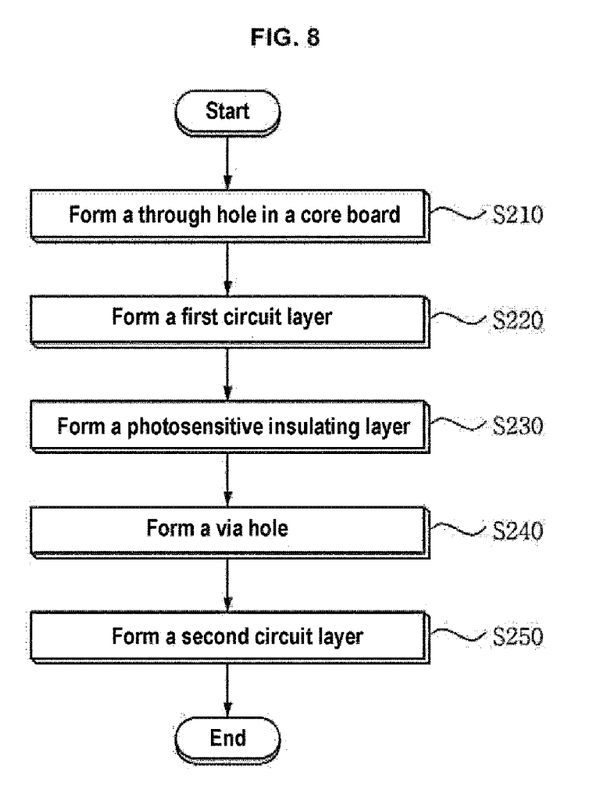
FIG. 8 is a flowchart illustrating another example of a method of manufacturing a printed circuit board according to the present disclosure.

FIG. 8 illustrates a flowchart of another example of a method of manufacturing a printed circuit board. FIG. 9 to FIG. 13 illustrate sectional views of an example of a method of manufacturing a printed circuit board according to the present disclosure.

Referring to FIG. 8, an example of a method of manufacturing a printed circuit board involves forming a through hole in a core board (S210), forming a first circuit layer (S220), forming a photosensitive resin layer (S230), forming a via hole (S240), and forming a second circuit layer (S250).

Each step will be explained with reference to sectional views illustrated in FIGS. 9 to 13.

Figure 9:
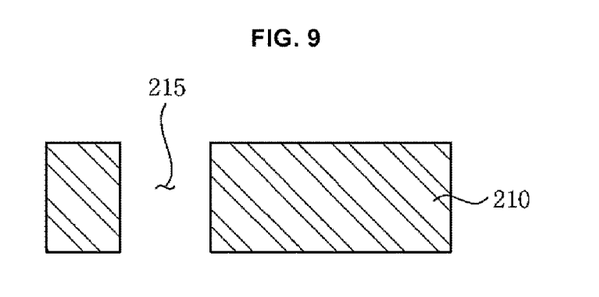
FIGS. 9 to 13 are sectional views illustrating another example of a method of manufacturing a printed circuit board according to the present disclosure.

Referring to FIG. 9, a core board 210 including a through hole 215 is prepared.

The core board 210 may be formed of any resin which is usually used as a core insulating layer material in the field of printed circuit boards. An example of the resin may include a thermosetting resin such as an epoxy resin, a thermoplastic resin such as polyimide, a photosensitive resin, or a resin thereof further including a reinforcing agent such as a glass fiber or an inorganic filler but it is not limited thereto.

The core board 210 may be prepared by eliminating metal layers from a metal laminate including the metal layers formed on both surfaces.

The through hole 215 may be formed, for example, using a CNC drill.

The through hole 215 may be designed to have a greater diameter than a via hole to be formed later.

Figure 10:
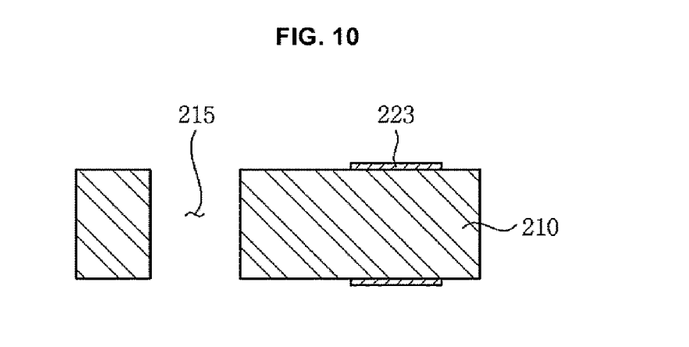

Referring to FIG. 10, first circuit layers 223 are formed on both surfaces of the core board 210.

In this example, the first circuit layers 223 each include a plurality of circuit patterns.

The first circuit layers 223 may be formed through a general circuit forming process such as a semi additive process(SAP), a modified semi additive process(MSAP), an additive process, and a subtractive process.

Figure 11:
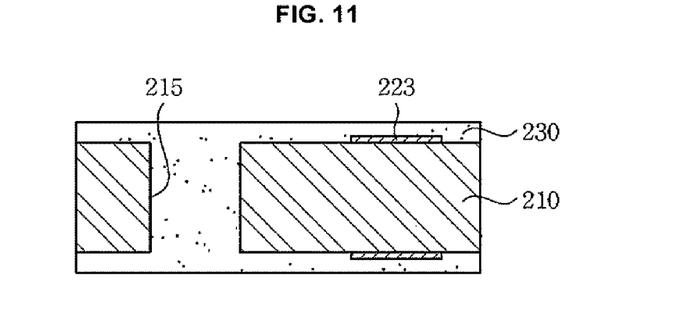

Referring to FIG. 11, an insulating layer 230 is compressed on both surfaces of the core board 210, on which the first circuit layers 223 are formed, to fill the through hole 215.

The insulating layer 230 may be a photosensitive resin layer.

Figure 12:
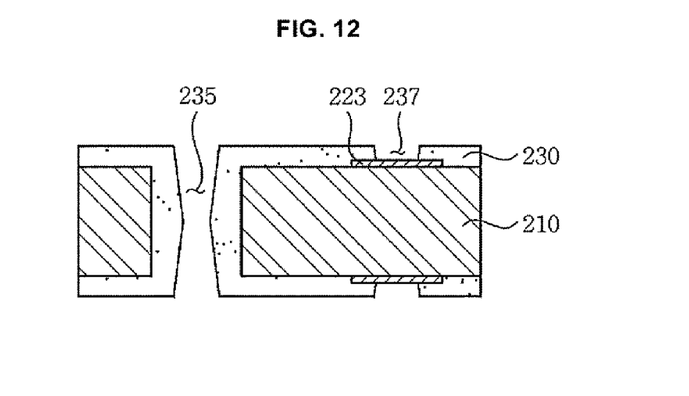

Referring to FIG. 12, a through via hole 235 and a blind via hole 237 are formed by processing the insulating layer 230 filled in the through hole 215.

In this example, the through via hole 235 is formed to have a smaller diameter than the through hole 215.

The via holes 235, 237 may be formed by the photolithography process including an exposing process and a developing process.

The through via hole 235 may be formed by processing in one surface of the insulating layer 230 or by processing in both the upper surface and the lower surface at the same time or in order.

The through via hole 235 may be formed in a cylindrical shape, in a tapered shape having a decreasing diameter toward one direction, or in an hourglass shape having a tapered part of a vertically symmetrical structure.

The present disclosure only illustrates the through via hole 235 in an hourglass shape which is formed by processing the upper surface and the lower surface of the insulating layer 230 but it may not be limited thereto.

According to one example of the present disclosure, when the via hole is formed, the photolithography process may be used, instead of a conventional laser process, to reduce a via size and provide fine circuits and fine pitches. In addition, when the photolithography process is used, it may further reduce manufacturing cost since a plurality of via holes are formed at the same time.

Figure 13:
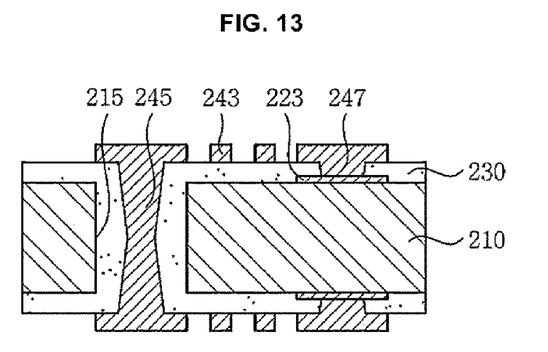

An insulating layer 230 and a second circuit layer 243 including vias 245, 247 disposed inside the via holes 235, 237 are then formed.

In this example, the second circuit layer 243 includes a plurality of circuit patterns.

Referring to the example illustrated in FIG. 13, a second circuit layer 243 including a plurality of circuit patterns is formed on the upper surface of the core board 210 and another second circuit layer 243 including a plurality of circuit patterns is formed on the lower surface of the core board 210.

In this example, the through via 245 penetrates through the board to electrically connect the second circuit layers 243 on both surfaces, and the blind vias 247 connect between the first circuit layer 223 and the second circuit layer 243.

The circuit layers 243 that include the vias 245, 247 may be formed through a general circuit forming process such as a semi additive process (SAP).

In one example in which the circuit layer is formed by the SAP, the step of forming the circuit layer 243 including the vias 245, 247 may include forming a seed layer inside the via holes 235, 237 and on the insulating layer 230, forming a metal plating layer including patterns on the seed layer using electro plating, and eliminating the part of the seed layer where the metal plating layer is not formed and thus exposed using a general flash etching process.

The seed layer may be formed by sputtering or immersion plating.

According to an embodiment of the present disclosure, a copper clad of a general copper clad laminate is not used as a seed layer but a metal layer formed using sputtering or immersion plating is used as a seed layer for electro plating, such that it may be able to provide high-density circuits.

According to an example of a printed circuit board and a method of manufacturing the same, a printed circuit board with fine patterns and fine pitches may be obtained, and a via size of the printed circuit board may be reduced.

According to another example of a printed circuit board and a method of manufacturing the same, it is possible to implement high density circuits in the printed circuit board.

According to another example of a printed circuit board and a method of manufacturing the same, a plurality of vias may be formed at the same time, thus reducing the manufacturing cost of producing the printed circuit board.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A printed circuit board comprising:
    an insulating layer comprising a first resin layer and a second resin layer;
    circuit layers disposed on upper and lower surfaces of the insulating layer; and
    a via configured to connect the circuit layer formed on the upper surface to the circuit layer formed on the lower surface,
    wherein the second resin layer extends from an upper surface of the first resin layer to a lower surface of the first resin layer by passing through the first resin layer as to contact a side surface of the via.

2. The printed circuit board of claim 1, wherein the second resin layer is a photosensitive resin layer.

3. The printed circuit board of claim 1, wherein the first resin layer comprises a core board having a through hole, and the second resin layer on an upper surface of the core board extends to the second resin layer on a lower surface of the core board via the through hole.

4. The printed circuit board of claim 1, wherein the via is formed in an hourglass shape.

5. A printed circuit board comprising:
    a core board with first circuit layers disposed on upper and lower surfaces of the core board;
    an insulating layer disposed on both the upper and lower surfaces of the core board and the first circuit layers;
    second circuit layers disposed on upper and lower surfaces of the insulating layer; and
    a through via disposed through the core board to connect the second circuit layer of the upper surface with the second circuit layer of the lower surface,
    wherein the insulating layer penetrates through the core board to surround a side surface of the through via.

6. The printed circuit board of claim 5, further comprising a blind via configured to connect between the first circuit layer and the second circuit layer.

7. The printed circuit board of claim 5, wherein the insulating layer is a photosensitive resin layer.

8. The printed circuit board of claim 5, wherein the through via has a tapered portion along a vertical direction of the printed circuit board.

9. A printed circuit board comprising:
a core insulating layer having a through hole;
a photosensitive resin layer disposed on an upper surface and a lower surface of the core insulating layer and inside the through hole;
circuit layers on an upper surface and a lower surface of the photosensitive resin layer; and
a via configured to interconnect the circuit layer on the upper surface to the circuit layer on the lower surface of the photosensitive resin layer,
wherein the via comprises a through via disposed on the photosensitive resin layer inside the through hole.

10. The printed circuit board of claim 9, further comprising an inner-circuit layer formed on each of the upper surface and the lower surface of the core insulating layer.

11. The printed circuit board of claim 9, wherein the through via has a tapered portion along a vertical direction of the printed circuit board.

12. A method of manufacturing a printed circuit board comprising:
preparing a core board comprising a through hole;
forming an insulating layer on both surfaces of the core board and filling the through hole;
forming a via hole through the insulating layer disposed in the through hole; and
forming a circuit layer comprising a via obtained by filling the via hole with a conductor.

13. The method of claim 12, wherein the insulating layer is a photosensitive resin layer.

14. The method of claim 12, wherein the forming of the via hole comprises performing a photolithography process.

15. The method of claim 12, wherein the forming of the via hole comprises forming a plurality of via holes at the same time using a photolithography process.

16. The method of claim 12, wherein the via hole has a smaller diameter than the through hole.

17. The method of claim 12, wherein the preparing of the core board comprises:
forming the through hole on the core board; and
forming an inner-circuit layer on both surfaces of the core board comprising the through hole.

18. The method of claim 12, wherein the preparing of the core board comprises:
obtaining a board with metal layers on both surfaces of the board;
eliminating metal layers from the both surfaces of the board; and
forming a through hole on the board from which the metal layers are eliminated.

19. The method of claim 12, wherein the forming of the circuit layer comprises:
forming a seed layer inside the via hole and on the insulating layer;
forming a metal plating layer patterned on the seed layer; and
eliminating a part of the seed layer from an area of the insulating layer where the metal plating layer is not formed to form a circuit layer.

20. The method of claim 19, wherein the forming of the seed layer is performed using sputtering or immersion plating.

* * * * *